United States Patent [19]
Casner et al.

[11] 4,072,904
[45] Feb. 7, 1978

[54] PRESETTABLE RATE MULTIPLIER

[75] Inventors: Paul G. Casner, Ellicott City; Edward J. McDevitt, Laurel, both of Md.

[73] Assignee: The United States of America as represented by the Secretary of the Navy, Washington, D.C.

[21] Appl. No.: 725,746

[22] Filed: Sept. 23, 1976

[51] Int. Cl.² .................... H03K 21/00; H03K 23/06
[52] U.S. Cl. ............................ 328/39; 307/225 R; 235/92 DM; 328/41; 328/46
[58] Field of Search ............... 307/225 R; 328/38, 39, 328/46, 41; 235/92 DM

[56] References Cited
U.S. PATENT DOCUMENTS

| 3,493,872 | 2/1970 | Sepe | 328/39 |
| 3,761,824 | 9/1973 | Stark et al. | 328/39 |
| 3,811,092 | 5/1974 | Charbonnier | 328/39 |
| 3,896,387 | 7/1975 | Kokado | 328/39 |
| 3,970,941 | 7/1976 | Leuschner | 328/46 |

Primary Examiner—Stanley D. Miller, Jr.

[57] ABSTRACT

The present invention relates to a logic circuit design for shortening the time required to perform a rate multiplier function. The invention is readily adaptable to multi-channel applications.

11 Claims, 2 Drawing Figures

PRESETTABLE RATE MULTIPLIER

BACKGROUND OF THE INVENTION

Rate multipliers are well-known to the art, being used in digital adder, subtracter, multiplier, square rooter and $e^x$ function circuits among others. The purpose of the rate multiplier is to produce an output frequency $f_{out}$ in response to an input frequency $f_{in}$, where the ratio between the two is shown in the following equation:

$$f_{out} = (M/N) f_{in}$$

In the prior art N had a constant value for a given rate multiplier, dependent on the number, $n$, of stages found in the rate multiplier, according to the equation:

$$N = 2^n.$$

If a rate multiplier had six-stages, for example, N would be $2^6$ or 64. Any frequency ratio from 1/64 through 63/64 could be implemented by the rate multiplier by properly selecting M to be 1,2, . . . 62,63 as required. In the prior art M was defined as:

$$M = F.2^5 + E.2^4 + D.2^3 + C.2^2 + B.2^1 + A.2^0$$

Setting rate inputs A through F to 1 or 0 as desired would produce the required M. In any instance, however, the prior art rate multiplier would require $N = 2^n$ inputs at $f_{in}$ to generate the appropriate $f_{out}$. Thus, if $f_{out}$ was to be half of $f_{in}$, M would be set with $F = i$ with A, B, C, D, E equal to $\phi$, thereby providing 32 output pulses for each 64 input pulses.

No matter what frequency ratio was sought, 64 input pulses were required by the prior art to produce the proper output frequency.

SUMMARY OF THE INVENTION

The presettable rate multiplier of the present invention provides two modes of operation. In one mode in which the presetting function is inhibited by use of the PRESET DISABLE input, the invention functions in manner identical to current rate multipliers. However, in the second mode, the invention performs rate multiplier functions in a time saving way. This time-saving is implemented in the invention by examining the digital inputs and presetting, or shutting off, unneeded counter stages in accordance with the digital inputs. By presetting the unneeded counter stages, the invention can produce predetermined frequency ratios with less than N (or 64 in the previous example) input pulses.

In effect, the present invention changes the value of N to N' which is calculated from the number of stages, $n'$, actually required to generate the frequency ratio in reduced form. The relationship between N' and $n'$ is $N' = 2^{n'}$.

For any reducible frequency ratio having a value greater than or equal to one-half, an $f_{out}$ can be generated faster by the present invention than by prior art rate multipliers. Using the six bit rate multiplier example, $f_{out}$ can be generated two to 32 times faster by the present invention.

Table 1 below illustrates the six bit invention example. The first line of the table shows that the present invention produces a frequency division of one half in two rather than 64 pulse periods. The second line indicates that with the present invention, an $f_{out} = 9/16 f_{in}$ condition takes only a quarter of the pulse periods required by previous rate multipliers. Line three shows that the invention operates identical to prior art rate multipliers without the preset feature for irreducible frequency ratios. Lines four and five show that reducible ratios less than a half are not subject to the abbreviation technique of the present invention and the preset disable feature of the invention must be employed. An "X" indicates that the counter stage corresponding to the appropriate rate input is preset.

The presetting of the stages is described below in the Description of the Preferred Embodiments.

Table 1

| CONDITION | INPUT PULSES REQ'D N | PRIOR ART | | | | | | INPUT PULSES REQ'D N' | INVENTION | | | | | |
|---|---|---|---|---|---|---|---|---|---|---|---|---|---|---|
| | | M | F | E | D | C | B | A | | M' | F' | E' | D' | C' | B' | A' |
| $f_{out}$ is 1/2 of $f_{in}$ | 64 | 32 | 1 | 0 | 0 | 0 | 0 | 0 | 2 | 1 | X | X | X | X | X | 1 |
| $f_{out}$ is 9/16 of $f_{in}$ | 64 | 36 | 1 | 0 | 0 | 1 | 0 | 0 | 16 | 9 | X | X | 1 | 0 | 0 | 1 |
| $f_{out}$ is 33/64 of $f_{in}$ | 64 | 33 | 1 | 0 | 0 | 0 | 0 | 1 | 64 | 33 | 1 | 0 | 0 | 0 | 0 | 1 |
| $f_{out}$ is 1/8 of $f_{in}$ | 64 | 8 | 0 | 0 | 1 | 0 | 0 | 0 | 64* | 8 | 0 | 0 | 1 | 0 | 0 | 0 |
| $f_{out}$ is 5/64 of $f_{in}$ | 64 | 5 | 0 | 0 | 0 | 1 | 0 | 1 | 64* | 5 | 0 | 0 | 0 | 1 | 0 | 1 |

*Preset Disable Function Employed

DESCRIPTION OF THE PREFERRED EMBODIMENTS

1. Single Channel Embodiment

Figure 1:
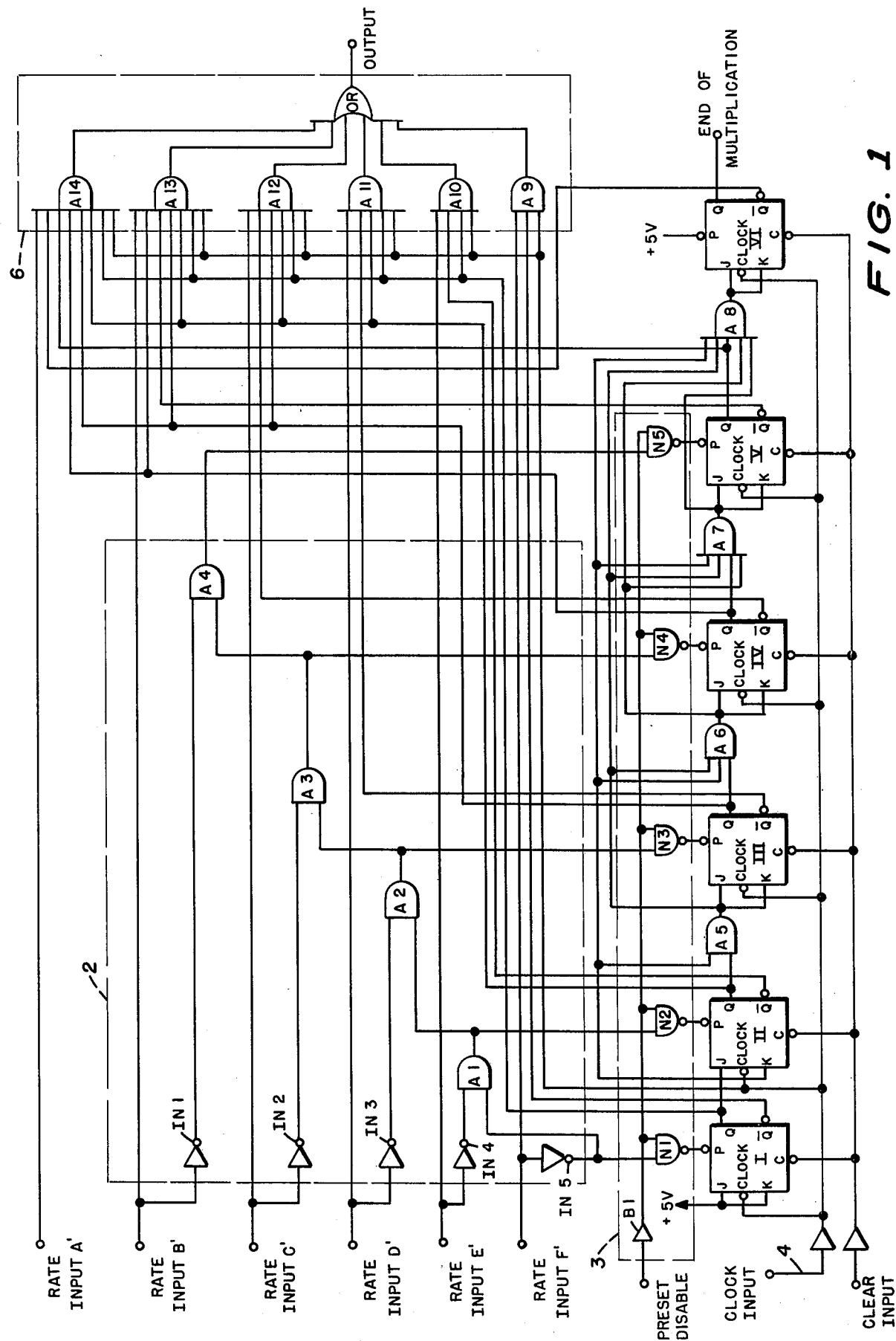
FIG. 1 illustrates a six bit example of the single channel embodiment of the present invention.

A plurality of counting stages I through VI are shown in FIG. 1, each provided with the preset input P. By way of example, J-K flip-flops are used for the counting stages I through VI operating in accordance with the standard truth table given below:

Table 2

| TRUTH TABLE | | |
|---|---|---|
| $t_n$ | | $t_{n+1}$ |
| J | K | Q |
| $\phi$ | $\phi$ | $Q_n$ |
| $\phi$ | 1 | $\phi$ |
| 1 | $\phi$ | 1 |
| 1 | 1 | $\overline{Q}_n$ |

Notes:
1. $t_n$ = Bit time before clock pulse
2. $t_{n+1}$ = Bit time after clock pulse The J-K flip flop has two data inputs, J and K, and only a single clock input. FIG. 1 shows that the J-K flip-flops used in the invention contain two asynchronous control inputs (preset P and clear C) and two outputs (Q and $\overline{Q}$). The truth table shows that all four possible input states generate defined output states when the clock input is applied. However, in accordance with standard J-K flip-flop operation, with the preset input P at 0, the Q output of the flip-flop is always a 1, and the $\overline{Q}$ output is always a 0, regardless of the states of the J, K and clock inputs. Contrarily, when the clear input C is 0, the Q output is always 0, and the $\overline{Q}$ output is always a 1, regardless of the states of the J, K and clock inputs.

The values of the presets are determined by preselected rate inputs A'... F' which are passed through logic circuitry 2 enroute to the preset inputs Ps of stages I through VI via the preset disabling circuitry 3. The disabling circuitry 3 is comprised of NAND gates N1 through N5 and buffer B1. When the PRESET DISABLE input is a 0, it forces all the preset inputs Ps of counter stages I through VI to become 1, inhibiting the preset function regardless of the inputs from the logic circuit 2.

Logic circuitry 2 is comprised, in the present embodiment, of inverters IN1 through IN5 and AND gates A1 through A4 which cause the rate inputs F' through A' to be examined sequentially for a preset indication. (i.e., rate inputs having a 0 value). In the following discussion, the PRESET DISABLE input to the invention is assumed to be a 1, thus allowing the preset function of the invention to be applied. Starting with the F' (most significant bit) rate input, a check for a preset indication (F' = 0) is made. A preset indication at rate input F' (F' = 0) will cause preset P of stages I to be 0 through a NAND GATE N1, and the Q output of stages I to be 1. J and K in stage II, which are connected to the Q output of stage I, are thus also 1. The presetting effectively excludes stage I from counting on each clock input from clock input line 4 and decreases the total number of clock pulses which will cause a counting overflow from 64 to 32 input pulses for the six bit rate multiplier shown in FIG. 1.

The counting overflow is represented by the change in stage of the last counting stage (stage VI), from a high $\overline{Q}$ output to a high Q output. In FIG. 1, the overflow is labelled END OF MULTIPLICATION on the Q output line of stage VI.

At the same time, the inverted value of rate input F' enters AND gate A1 together with the inverted value of rate input E'. If both rate inputs E' and F' are 0, AND gate A1 will put out a 1, which will cause the output of NAND GATE, N2, to be a 0, thereby also presetting stage II of the counter. Similarly, the presets Ps for stages III, IV, and V cannot be set to 0 unless the rate inputs (and thus the presets Ps) for all previous stages are also 0. The highest order rate input which is not preset to 0 requires that the preset status of all lower order presets Ps will be 1.

To insure the proper counting operation of stages III through VI, AND gates A5 through A8 are provided. By connecting all J and K values (which are themselves connected together) to the Q values from all previous stages, it is assured that: first, each stage will count at half the rate of a previous counting stage and, second, the presetting of an earlier stage will not inhibit the counting in subsequent stages.

Gating circuitry 6 (in FIG. 1), receiving pulsed inputs on clock input line 4, is provided which gates each rate input A' through F' with selected outputs from counting stages I through VI.

The $\overline{Q}$ output of a given stage is ANDed with the Q outputs of all preceeding stages together with the lowest-order rate input (A' through F') included in the preset calculations for the given stage. In particular, an AND gate A9 of gating circuitry 6 pulses when the rate input F' and the $\overline{Q}$ output of stage I are 1 during any clock pulse from clock 4; AND gate A10 pulses when rate input E' together with the Q output of stage I and the $\overline{Q}$ output of stage II are 1 during any clock pulse; AND gate A11 pulses when rate input D' together with the Q outputs of stages I and II and the $\overline{Q}$ output of stage III are 1 at any clock pulse; and so on through AND gate 14 of gating circuitry 6. The outputs from AND gates A9 through A14 enter an OR gate which produces an output from gating circuitry 6 whenever any AND gate A9 through A14 is in a 1 state.

It should be noted that the higher the significance of the rate input (F' through A'), the lower the significance of the corresponding counting stage (which is presettable by the rate input F' through A'). By way of example, if rate input F' is not preset all stages I through VI will be counting with stage I representing the least significant bit. Further, if rate input F' is preset and rate input E' is not preset, stage II will contain the least significant bit in the count and only stages II through VI will be active in the counting and so on.

The higher the significance of the first non-preset rate input, the more stages are used in the counting. The following example will illustrate the time-saving feature of the present invention.

Assume an $f_{out}$ is to be 9/16 of $f_{in}$. According to the invention, $N' = 16$ and $M' = 0 \cdot 2^5 + 0 \cdot 2^4 + 1 \cdot 2^3 + \cdot 2^2 + \lambda 0 \cdot 2^1 + \cdot 2^0$, or F', E', C', and B' equal 0 with D' and A' equal to 1. The 0 value for the F' rate input causes stage I to be preset, or inactive during the counting. The 0 value for the E' rate input similarly presets stage II. The 1 value for the D' rate input causes stage III not to be preset and, thus, stages III through VI remains active during the counting. The counting is performed over 16 clock inputs on clock input line 4. Table 3 indicates which AND gate, if any, in logic circuit 6 producrs a 1 output. Table 3 assumes that the counting begins following a CLEAR input C to all stages, the effect of which has been explained earlier.

Table 3

| Q values for counting stages | | | | |
|---|---|---|---|---|
| CLK | III | IV | V | VI | AND gate in "1" state |
| 0 | φ | φ | φ | φ | A11 |
| 1 | 1 | φ | φ | φ | |
| 2 | φ | 1 | φ | φ | A11 |
| 3 | 1 | 1 | φ | φ | |
| 4 | φ | φ | 1 | φ | A11 |
| 5 | 1 | φ | 1 | φ | |
| 6 | φ | 1 | 1 | φ | A11 |
| 7 | 1 | 1 | 1 | φ | A14 |
| 8 | φ | φ | φ | 1 | A11 |
| 9 | 1 | φ | φ | 1 | |
| 10 | φ | 1 | φ | 1 | A11 |
| 11 | 1 | 1 | φ | 1 | |
| 12 | φ | φ | 1 | 1 | A11 |
| 13 | 1 | φ | 1 | 1 | |
| 14 | φ | 1 | 1 | 1 | A11 |
| 15 | 1 | 1 | 1 | 1 | |

Referring to the previous table it can be noted that only AND gates A11 and A14 can have a 1 state because no other AND gates (from amoong A9 through A14) have a rate input entered in the 1 state. AND gates A11 and A14 are in the 1 state a total of nine times every 16 clock inputs thereby producing the desired output frequency.

DUAL CHANNEL EMBODIMENT

Figure 2:
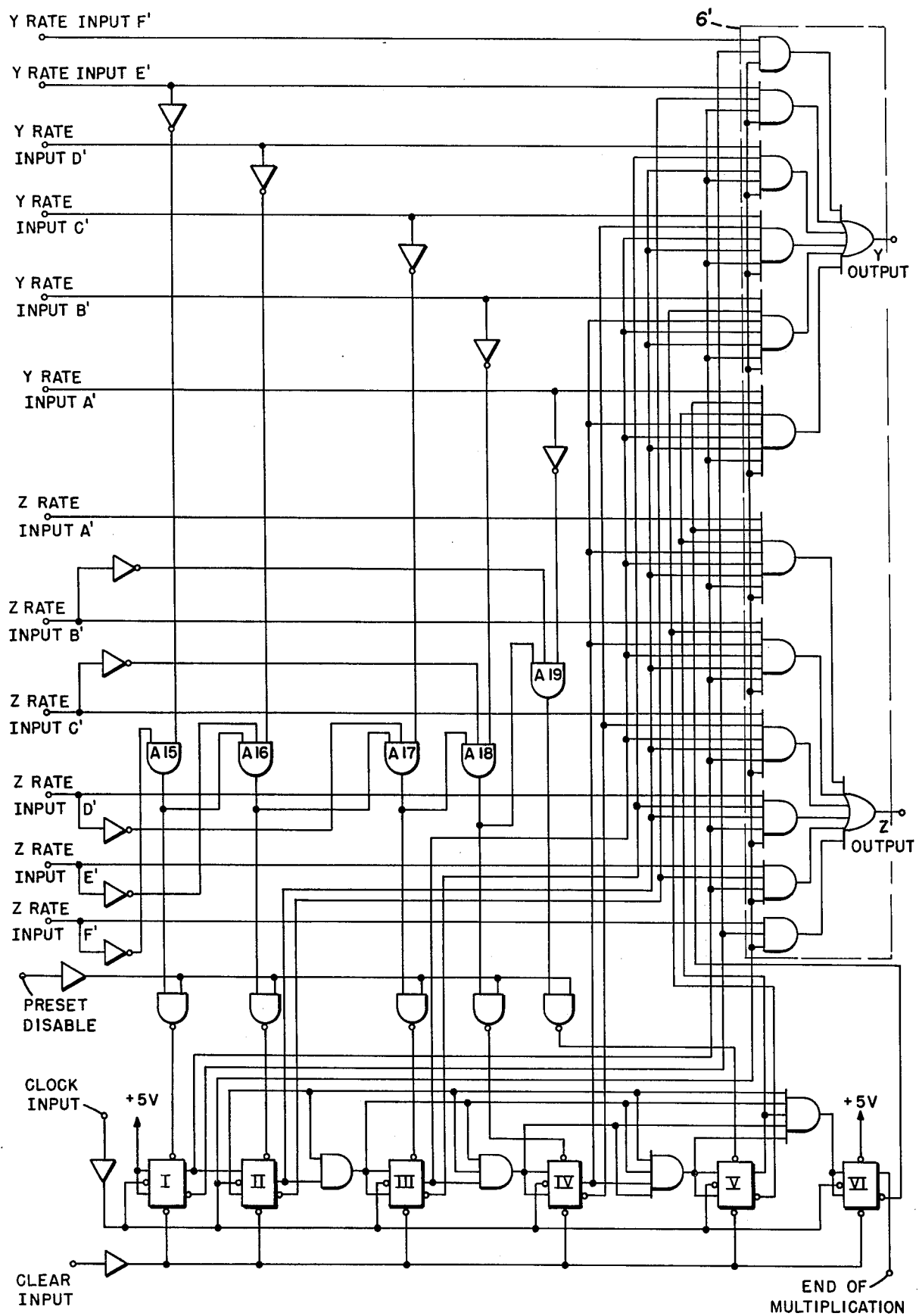
FIG. 2 illustrates a six bit example of the two channel embodiment of the present invention.

Reference is now made to FIG. 2 which is the same as FIG. 1 except that two sets of rate inputs, referred to as the Y set and the Z set, are provided. Additional gating (AND gates A5 through A19) is shown which conditions the presetting of the stages on the requirement that the corresponding rate input from both the Y and Z set are 0 when the PRESET DISABLE input is a 1. More specifically, for stage I to be preset (and excluded from the counting), the F' rate input in both the Y set and Z set must be 0. Dual channel gating circuitry 6' is similar to the gating circuitry 6 of the single channel embodiment, except that additional AND gates corresponding to each rate input A' through F' in both the Y and Z sets are provided. A Y OUTPUT line and a Z OUTPUT line are available so that two output frequencies can be generated simultaneously, employing the time-saving feature.

It should be evident that additional gating could be provided to increase the number of channels and thus the number of output frequencies which can be generated while remaining within the scope of the invention.

Various other modifications, adaptations and alterations are also possible in light of the above teachings. Therefore, it should be understood at this time that within the scope of the appended claims the invention may be practiced otherwise than as specifically described.

What is claimed is:

1. A rate multiplier, having a plurality of ordered rate inputs and a clock input, for generating an output frequency $f_{out}$ which is a fraction of an input frequency $f_{in}$, comprising:
    a series of connected counting stages, each counting stage being clocked by the input clock and having a preset input which, when enabled, locks the counting stage into a given output state which inhibits the counting stage from counting when clocked, and
    logic circuit means, having the ordered rate inputs as inputs and having outputs connected to the series of connected counting stages, for controlling the enabling of the preset input of each counting stage so that no preset input can be enabled unless the preset inputs of all previous counting stages in the series are also enabled.

2. A rate multiplier as in claim 1, further comprising:
    a CLEAR input for initializing the output of all counting stages and
    an END OF MULTIPLICATION output connected to the output of the last counting stage, the END OF MULTIPLICATION output being produced when the last counting stage switches from one predetermined state to the other.

3. A rate multiplier as in claim 1 wherein the logic circuit means comprises:
    first inverter means connected to invert each, but the lowest order, rate input and
    means for ANDing the inverted rate input of a given stage with all higher order inverted rate inputs.

4. A rate multiplier as in claim 3, wherein each, but the lowest order, rate input is inverted and then ANDED with all higher order rate inputs, in the logic circuit means, the ANDED output representing the value of the preset input of a corresponding counting stage.

5. A rate multiplier as in claim 1, wherein,
    each rate input is connected to a corresponding preset input through the logic circuit means, where the higher the order of the rate input the earilier in the series the corresponding counting stage.

6. A rate multiplier as in claim 5, wherein the order of the rate inputs is defined by the term $$M' = F' \cdot 2^{(n'-1)} + E' \cdot 2^{(n'-2)} + \ldots + A' \cdot 2^0$$

where $F', E', \ldots,$ and $A'$ are rate inputs of decreasing order and $M'$ represents the number of output pulses produced in response to $N'$ pulses from the clock input and
    where $N' = 2^{n'}$ where $n'$ represents the number of non-preset counting stages.

7. A rate multiplier as in claim 5, further comprising:
    an output and a complement output from each counting stage, and
    gating circuitry for logically combining each rate input with selected outputs and complement outputs from the plurality of counting stages. pg,16

8. A rate multiplier as in claim 7, wherein each rate input is gated with both the complement output of the counting stage having the preset input corresponding to the rate input and the outputs of all less significant counting stages.

9. A rate multiplier as in claim 5, further comprising:
    a plurality of channels each having a rate input equal in order to a rate input in each of the other channels, and
    gate means for logically ANDing all rate inputs of equal order, the gate means output being entered into one corresponding preset input.

10. A rate multiplier as in claim 9, wherein a separate $f_{out}$ is generated for each channel of rate inputs.

11. A rate multiplier as in claim 10, further comprising a plurality of rate input channels, each channel having rate inputs of the same order wherein the inverted rate inputs of the same order generated in each channel are ANDed in the ANDing means together with the higher order rate inputs of all the channels after which the ANDing means output signal is fed into the preset input corresponding to the order of the rate input.

* * * * *